United States Patent
Elmegreen et al.

(10) Patent No.: US 8,213,224 B2
(45) Date of Patent: Jul. 3, 2012

(54) HIGH DENSITY LOW POWER NANOWIRE PHASE CHANGE MATERIAL MEMORY DEVICE

(75) Inventors: Bruce G. Elmegreen, Yorktown Heights, NY (US); Lia Krusin-Elbaum, Yorktown Heights, NY (US); Dennis M. Newns, Yorktown Heights, NY (US); Robert L. Sandstrom, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 12/624,141

(22) Filed: Nov. 23, 2009

(65) Prior Publication Data

US 2011/0122682 A1    May 26, 2011

(51) Int. Cl.
   *G11C 11/00* (2006.01)
(52) U.S. Cl. ........ 365/163; 365/113; 365/115; 365/148; 365/175; 365/177
(58) Field of Classification Search .................... 365/163
   See application file for complete search history.

(56) References Cited

U.S. PATENT DOCUMENTS

| 5,406,509 | A  | 4/1995 | Ovshinsky et al. |
| 7,045,421 | B2 | 5/2006 | Rueckes et al. |
| 7,221,579 | B2 | 5/2007 | Krusin-Elbaum et al. |
| 7,405,420 | B1 | 7/2008 | Wong et al. |
| 7,420,199 | B2 | 9/2008 | Gutsche et al. |
| 2005/0211978 | A1 | 9/2005 | Bu et al. |
| 2006/0034116 | A1 | 2/2006 | Lam et al. |
| 2007/0131980 | A1 | 6/2007 | Lung |
| 2007/0187744 | A1 | 8/2007 | Kreupl |
| 2008/0247226 | A1 | 10/2008 | Liu et al. |
| 2010/0048020 | A1* | 2/2010 | Schrott et al. ................ 438/692 |
| 2010/0323492 | A1* | 12/2010 | Lee ................................ 438/382 |

OTHER PUBLICATIONS

A. I. Boukai et al.; "Silicon nanowires as efficient thermoelectric materials;" Nature Letters, vol. 45; Jan. 10, 2008; pp. 168-171.
K. N. Chen et al.; "Programmable via Using Indirectly Heated Phase-Change Switch for Reconfigurable Logic Applications;" IEEE Electron Device Letters, vol. 29, No. 1; Jan. 2008; pp. 131-133.
A. I. Hochbaum et al.; "Enhanced thermoelectric performance of rough silicon nanowires;" Nature Letters; vol. 451; Jan. 10, 2008; pp. 163-167.
L. J. Lauhon et al.; "Epitaxial core-shell and core-multishell nanowire heterostructures;" NATURE, vol. 420, 7 Nov. 2002; pp. 57-61.
H. T. Ng et al.; "Single Crystal Nanowire Vertical Surround-Gate Field-Effect Transistor," NANO Letters, vol. 4, No. 7; 2004; pp. 1247-1252. V. Schmidt et al.; "Realization of a Silicon Nanowire Vertical Surround-Gate Field-Effect Transistor;" SMALL 2006, 2, No. 1, pp. 85-88.
C. Yang et al.; "Encoding Electronic Properties by Synthesis of Axial Modulation-Doped Silicon Nanowires;" Science 310, (2005); pp. 1304-1307.
Yi Zhang, et al; "Multi-Bit Storage in Reset Process of Phase-Change Random Access Memroy (PRAM);" Phys. Sat. Sol. (RRL), 2007, pp. R28-R30, No. 1 Wiley-VCH Verlag GmbH & Co. KGaA, Weinheim.

* cited by examiner

*Primary Examiner* — Hoai V Ho
*Assistant Examiner* — Pablo Huerta
(74) *Attorney, Agent, or Firm* — Cantor Colburn LLP; Vazken Alexanian

(57) ABSTRACT

A memory cell device includes a semiconductor nanowire extending, at a first end thereof, from a substrate; the nanowire having a doping profile so as to define a field effect transistor (FET) adjacent the first end, the FET further including a gate electrode at least partially surrounding the nanowire, the doping profile further defining a p-n junction in series with the FET, the p-n junction adjacent a second end of the nanowire; and a phase change material at least partially surrounding the nanowire, at a location corresponding to the p-n junction.

20 Claims, 8 Drawing Sheets

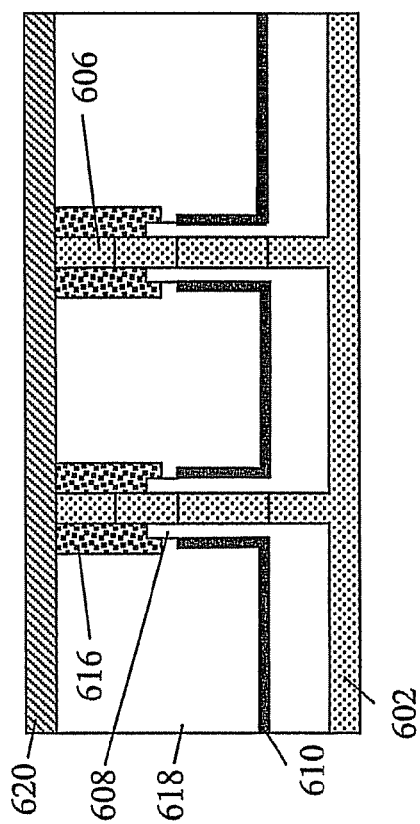
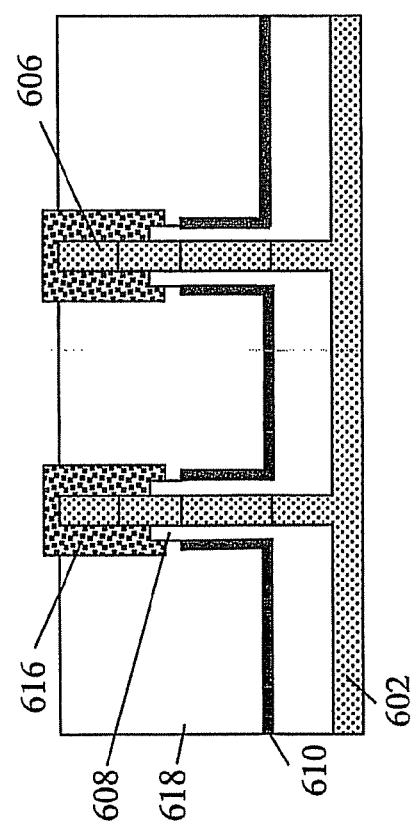
Figure 6(j)
Figure 6(i)

HIGH DENSITY LOW POWER NANOWIRE PHASE CHANGE MATERIAL MEMORY DEVICE

BACKGROUND

The present invention relates generally to integrated circuit memory devices and, more particularly, to a high density, low power nanowire phase change material (PCM) memory device.

There are numerous contemporary applications where a compact, non-volatile memory with no moving parts would be an enabling technology. Such examples include portable computing and communication devices, computers that use low power, etc. Current techniques for achieving non-volatile memory include magnetic random access memory (MRAM), FLASH, and ferroelectric random access memory (FeRAM). At the present time, the capacities and speeds of these memories in practical devices are comparable with the capacities of dynamic random access memory (DRAM) chips, which is a volatile type of memory that requires continuous power in order to retain the data therein. In addition, DRAM is also relatively slow. Regardless, none of these types of memory described above can compete with the high volumes in disk storage.

A new technology, Phase Change Material (PCM), is now becoming available and seems well-suited for non-volatile memory technology. The phase change material is typically a ternary alloy of germanium (Ge), antimony (Sb) and tellurium (Te) (GST), with a typical composition being $Ge_2Sb_2Te_5$, also referred to as GST 225. The GST material is interconvertible between two discrete states, amorphous (high electrical resistance) and crystalline (low electrical resistance), thereby enabling data storage therein. The interconversion or write process is done by thermal cycling of the PCM.

The challenge in any storage class memory, including those formed from PCM elements, is the achievement of ultra-high storage densities. Accordingly, it would be desirable to be able to provide a PCM memory device with an ultra-high storage density characterized by an aggressively low footprint memory cell.

SUMMARY

In an exemplary embodiment, a memory cell device includes a semiconductor nanowire extending, at a first end thereof, from a substrate; the nanowire having a doping profile so as to define a field effect transistor (FET) adjacent the first end, the FET further including a gate electrode at least partially surrounding the nanowire, the doping profile further defining a p-n junction in series with the FET, the p-n junction adjacent a second end of the nanowire; and a phase change material at least partially surrounding the nanowire, at a location corresponding to the p-n junction.

In another embodiment, a memory array includes a plurality of semiconductor nanowires extending, at a first end thereof, from a substrate; each nanowire having a doping profile so as to define a field effect transistor (FET) adjacent the first end, each FET further including a gate electrode at least partially surrounding the nanowire, the doping profile further defining a p-n junction in series with the FET, the p-n junction adjacent a second end of the nanowire; a phase change material (PCM) at least partially surrounding the nanowire, at a location corresponding to the p-n junction, a plurality of data lines connected to the second end of the nanowires; and a plurality of control lines connected to the gate electrode of the FETs.

In another embodiment, a method of operating a memory array is provided, the memory array including a plurality of semiconductor nanowires extending, at a first end thereof, from a substrate, with each nanowire having a doping profile so as to define a field effect transistor (FET) adjacent the first end, each FET further including a gate electrode at least partially surrounding the nanowire, the doping profile further defining a p-n junction in series with the FET, the p-n junction adjacent a second end of the nanowire, a phase change material (PCM) at least partially surrounding the nanowire, at a location corresponding to the p-n junction, a plurality of data lines connected to the second end of the nanowires, and a plurality of control lines connected to the gate electrode of the FETs. The method includes performing a write operation by coupling unselected control lines and the substrate to a ground voltage, while coupling a selected control line to a negative voltage; and coupling one or more selected data lines to a positive voltage so as cause a programming current to flow through each p-n junction corresponding to a selected control line and a selected data line, the programming current causing the PCM to assume one of a high resistance amorphous state and a low resistance crystalline state, depending on a duration and a magnitude of the programming current.

In still another embodiment, a method of forming a memory array includes growing a plurality of semiconductor nanowires extending, at a first end thereof, from a substrate; doping each nanowire so as to define a field effect transistor (FET) doping region adjacent the first end, and a p-n junction in series with the FET doping region, the p-n junction adjacent a second end of the nanowire; forming a gate dielectric layer over the nanowires and the substrate; forming a gate electrode layer over the gate dielectric layer; forming a first patterning layer over the gate electrode layer; removing portions of the gate electrode layer not protected by the first patterning layer so as to define a gate electrode at least partially surrounding a transistor portion of each nanowire; forming a second patterning layer over the first patterning layer; removing portions of the gate dielectric layer not protected by the second patterning layer so as expose the second end of each nanowire including the p-n junction; and forming a phase change material (PCM) over the second end of each nanowire, including the p-n junction.

BRIEF DESCRIPTION OF THE SEVERAL VIEWS OF THE DRAWINGS

Referring to the exemplary drawings wherein like elements are numbered alike in the several Figures:

FIGS. 6(a) through 6(j) are a series of cross-sectional views illustrating an exemplary process of forming a nanowire PCM memory element, in accordance with a further embodiment of the invention.

DETAILED DESCRIPTION

PCM memories for computers are being intensively investigated because of attractive features such as non-volatility and speed. Both two-terminal (directly heated) and multiterminal (indirectly heated) PCM memory elements may be configured in crossbar memory arrays with a local diode or transistor switch to control read and write access. It would be highly desirable to increase memory density and lower the relatively high PCM write power as these are among the competitive features in memory which control access to the market.

Disclosed herein a technological solution yielding very high memory density and extremely low write power that is based on implementing an indirectly heated PCM memory cell in the developing technology of nanowires. In this memory concept, a small droplet of PCM is wrapped around a silicon nanowire at a p-n junction in the nanowire. Forward conduction in the p-n junction diode thermally switches the PCM between its high conducting and low conducting states. The memory is read by applying a voltage across the nanowire in the reverse-biased direction with respect to the p-n junction diode. If the PCM is nonconductive, then both the reversed-biased diode and the PCM in parallel with the diode will block substantially any current from flowing through the device. On the other hand, if the PCM is conductive, then the reversed-biased applied voltage will cause current to pass around the diode, flowing through the PCM. A result, a high-density memory device (e.g., 10 GB/cm$^{-2}$) with low write power (e.g., about 10 µW) may be fabricated with minor modifications to existing nanowire FET processes.

In an exemplary embodiment, the PCM used herein may be a ternary alloy of germanium (Ge), antimony (Sb) and tellurium (Te) (GST), with an exemplary composition being $Ge_2Sb_2Te_5$, however other compositions such as $GeSb_4$, (including substitution/addition of other elements) are contemplated within the scope of the present disclosure.

Figure 1:
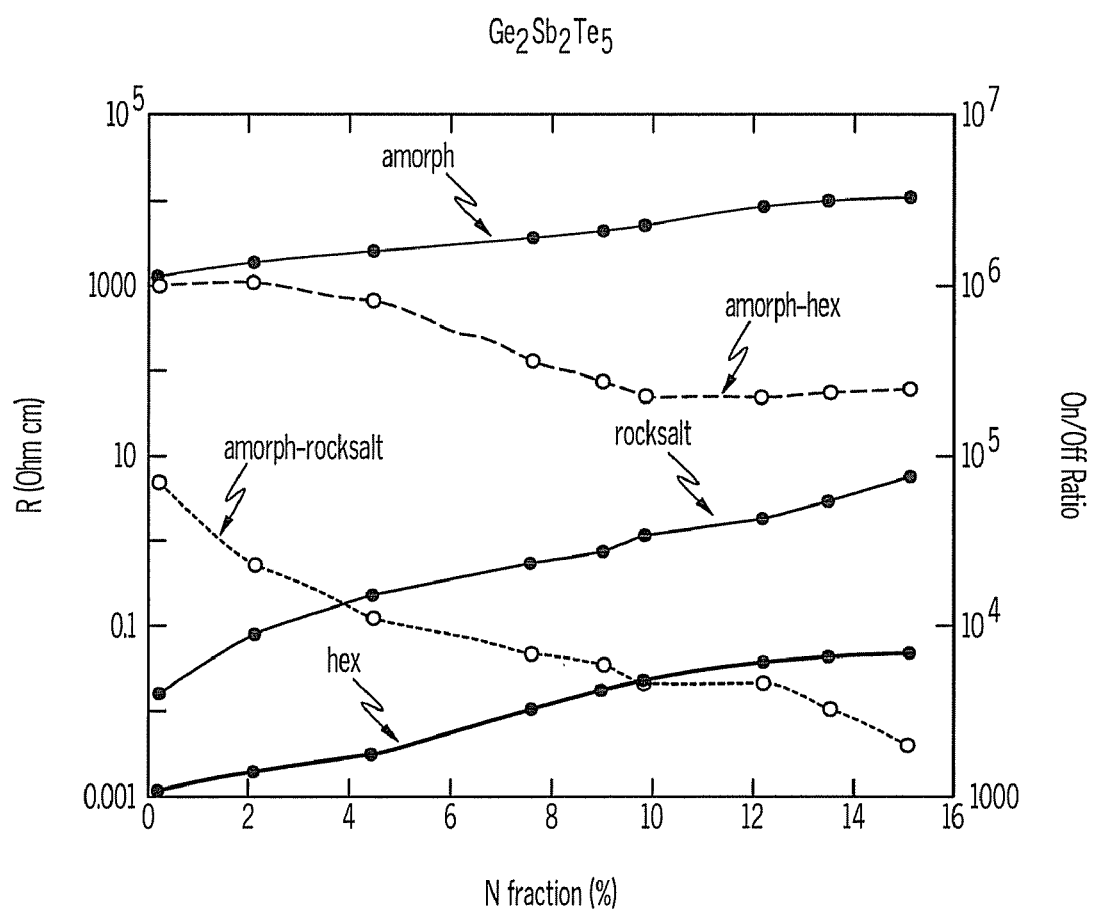
FIG. 1 is a graph illustrating the resistivity of various phases of $Ge_2Sb_2Te_5$ as a function of nitrogen doping.
Figure 2:
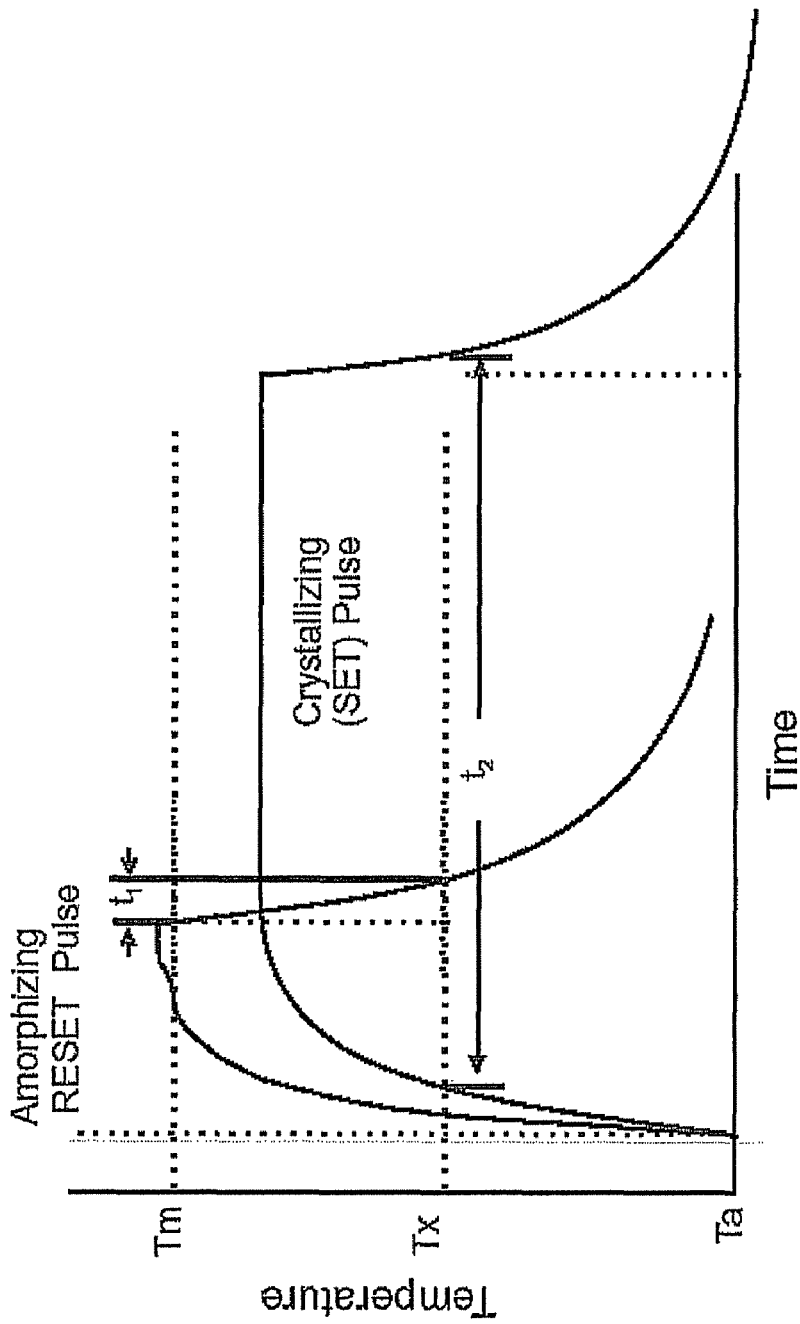
FIG. 2 is a graph illustrating the exemplary thermal cycling operations of a phase change material.

At room temperature, and up to moderately elevated temperatures, a PCM is stable in two phases: a crystalline phase, which is a moderately good conductor of electricity, and an amorphous phase, which is insulating. For example, FIG. 1 is a graph illustrating the resistivity of various phases of $Ge_2Sb_2Te_5$ as a function of nitrogen doping. The phases of a PCM such as $Ge_2Sb_2Te_5$ are interconverted by thermal cycling, as illustrated by the graph shown FIG. 2. The thermal cycling consists of (a) the so called "RESET" pulse which describes the conversion from crystalline to amorphous form (here, the temperature is raised above melting, followed by a rapid quench in a time $t_1$ as a result of which the disordered arrangement of atoms in the melt is retained); and (b) the so-called "SET" pulse, in which an anneal at a lower temperature (for a somewhat longer time $t_2$), enables the amorphous form to crystallize.

Most PCM memories are 2-terminal, having either an FET or a diode switch at each element of the crossbar. However, it is also possible for the heat to originate in a thermally coupled heater element in a separate electrical current path from the PCM. In either instance, switching powers on the order of about several tenths of a mW are required for PCM volumes typical of the technology today.

Silicon nanowires represent a new form of semiconductor structure capable of patterning and functionalization. The nanowire state exhibits certain unique properties, such as low thermal conductivity for example. A new technological capability of growing silicon nanowires vertically from an array of catalyst particles positioned onto a silicon substrate enables the fabrication of very high density circuits in which the current flow is axial within the nanowires, and hence orthogonal to the silicon substrate. The nanowires may be doped with either p-type or n-type dopant (or both), and the doping may have different concentrations at different locations along the nanowire. Given this doping capability of nanowires, the technology for building coaxially configured, "surround gate" field effect transistors (FETs) along the nanowires thus exists. Given this capability, the present embodiments provide a compelling memory application for such nanowire technology that may be implemented with relatively small additional overhead with respect to nanowire transistor arrays.

Figure 3B:
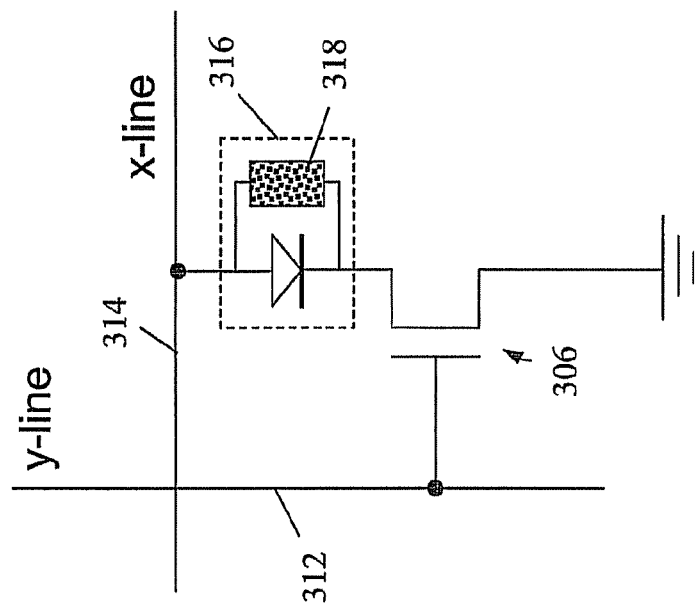
FIG. 3(b) is a schematic diagram of an equivalent circuit for the nanowire PCM memory element shown in FIG. 3(a)
Figure 3A:
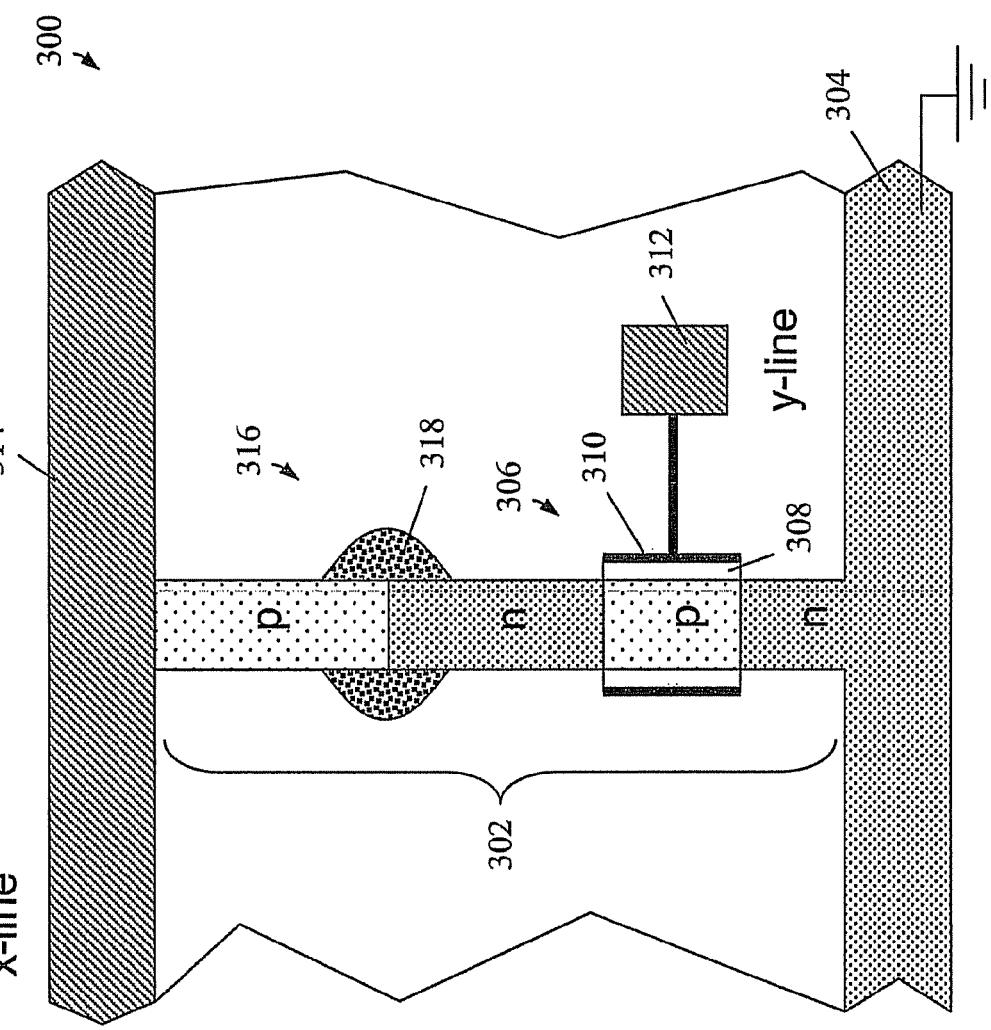
FIG. 3(a) is a cross-sectional view of a nanowire PCM memory element, in accordance with an embodiment of the invention.

Referring now to FIG. 3(a), there is shown a cross-sectional view of a nanowire PCM memory element 300, in accordance with an embodiment of the invention. As is shown, a vertically oriented silicon nanowire 302 is grown from a substrate 304. The vertical nanowire 302 is shown with doping patterns of n, p, n and p, beginning from the bottom (although the reverse arrangement is also possible). The lower n-p-n region forms an axial FET 306 having a gate oxide 308 and a gate electrode 310 wrapped around part or all of the circumference of the nanowire 302, wherein the gate electrode 310 is also connected to one of a plurality of conductive y-lines 312 used to form a crossbar type memory array. The FET 306 is to control access to the memory element. As further shown in FIG. 3(a), a conductive x-line 314 (orthogonal to the y-line 312) is coupled to the opposite end of the nanowire 302 with respect to the substrate 304.

A memory element 316 is defined by PCM 318 formed as a coating around, or in the vicinity of, the upper p-n junction in the nanowire 302. An equivalent circuit of this device is depicted in the schematic diagram of FIG. 3(b). When current passes in the forward direction through the upper p-n junction (i.e., from top to bottom in the figures) there is a voltage drop of about 0.7 V across the junction, leading to heat generation in the neighborhood of the junction. This heat may be used to change the conductive state of the PCM 318 (i.e., perform a write operation), which makes this design one type of an externally heated PCM device. If the current is high enough, the temperature reached in the PCM may be sufficient to melt the material in the vicinity of the nanowire 302. A sudden drop in such current will in turn cause the temperature to drop suddenly, thus resulting in the phase of the PCM 318 changing from crystalline to amorphous (i.e., the previously described RESET pulse). In contrast, a lower temperature (smaller current) turned off relatively slowly will cause the phase of the PCM 318 to change to crystalline (i.e., the SET pulse). In the amorphous phase, the PCM 318 is a semiconductor material while, in the crystalline phase, PCM 318 is a semi-metallic conductor. As such, electrically distinguishable states of the PCM 318 may be written by an appropriate time sequence and magnitude of applied current through the nanowire 302.

The PCM memory element 316 is read by applying a reverse bias voltage across the diode defined by the upper p-n junction. If the PCM 318 is in its amorphous insulating state, then very little current will flow because the diode blocks the current through the nanowire itself and the PCM 318 prevents any significant current from flowing around the diode junction. However, if the PCM 318 is in its crystalline conducting state, then a current will flow through the PCM 318, shunted around the diode junction, and this current may be sensed in the x-line 314.

Figure 4:
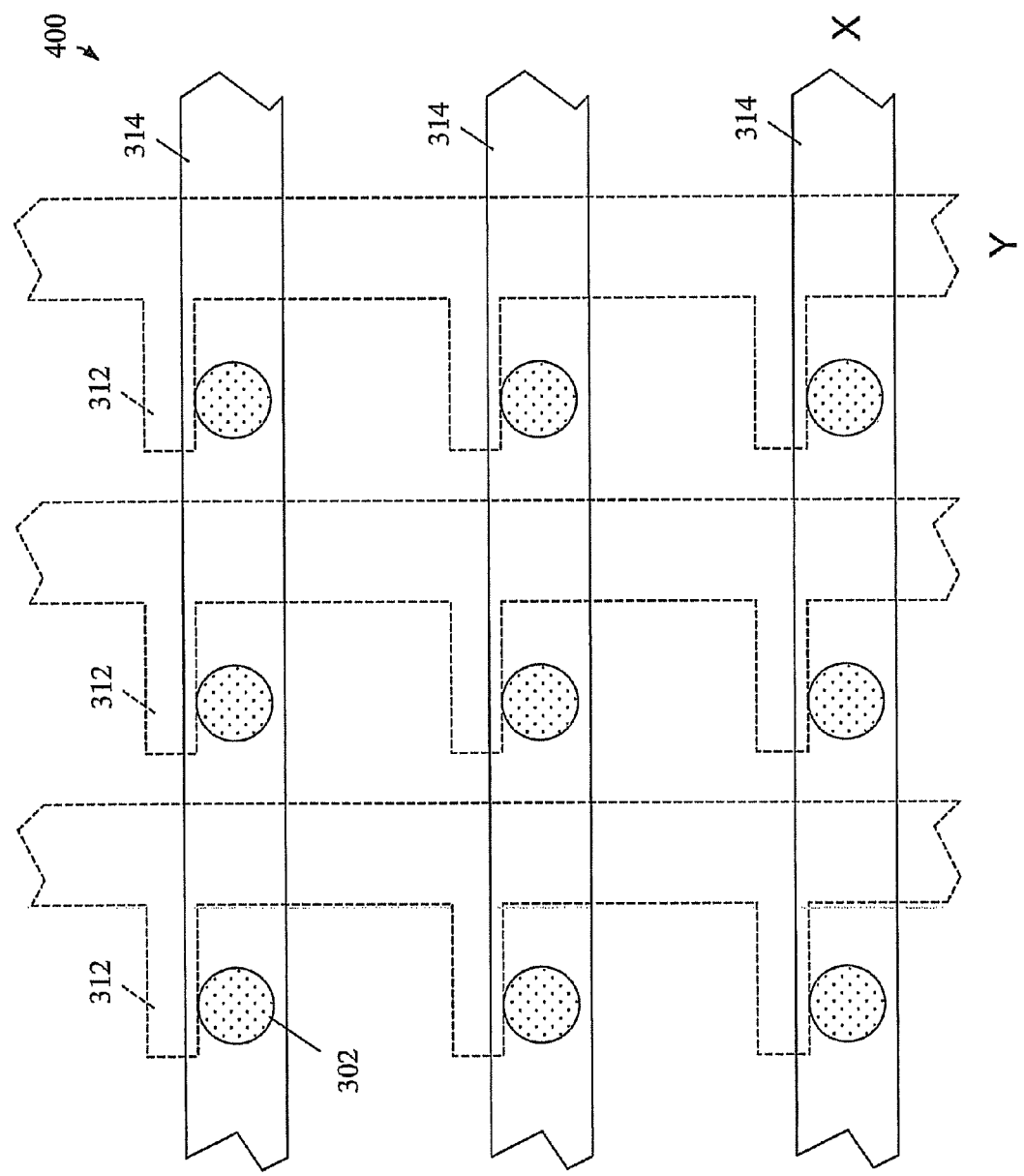
FIG. 4 is a top view of a nanowire PCM memory array, using individual PCM memory elements, in accordance with a further embodiment of the invention.

Referring now to FIG. 4, there is shown a top view of a nanowire PCM memory array 400, using individual PCM memory elements 316 such as shown in FIG. 3(*a*). The top view of the crossbar array 400 specifically illustrates nanowires 302, viewed axially and represented by circles. The x-lines (i.e., data lines) 314 contact the top ends of the nanowires 302, while the y-lines (i.e., control lines, shown in dash) 312, disposed orthogonal with respect to the x-lines, contact the FET gates 310 from FIG. 3(*a*).

Figure 5:
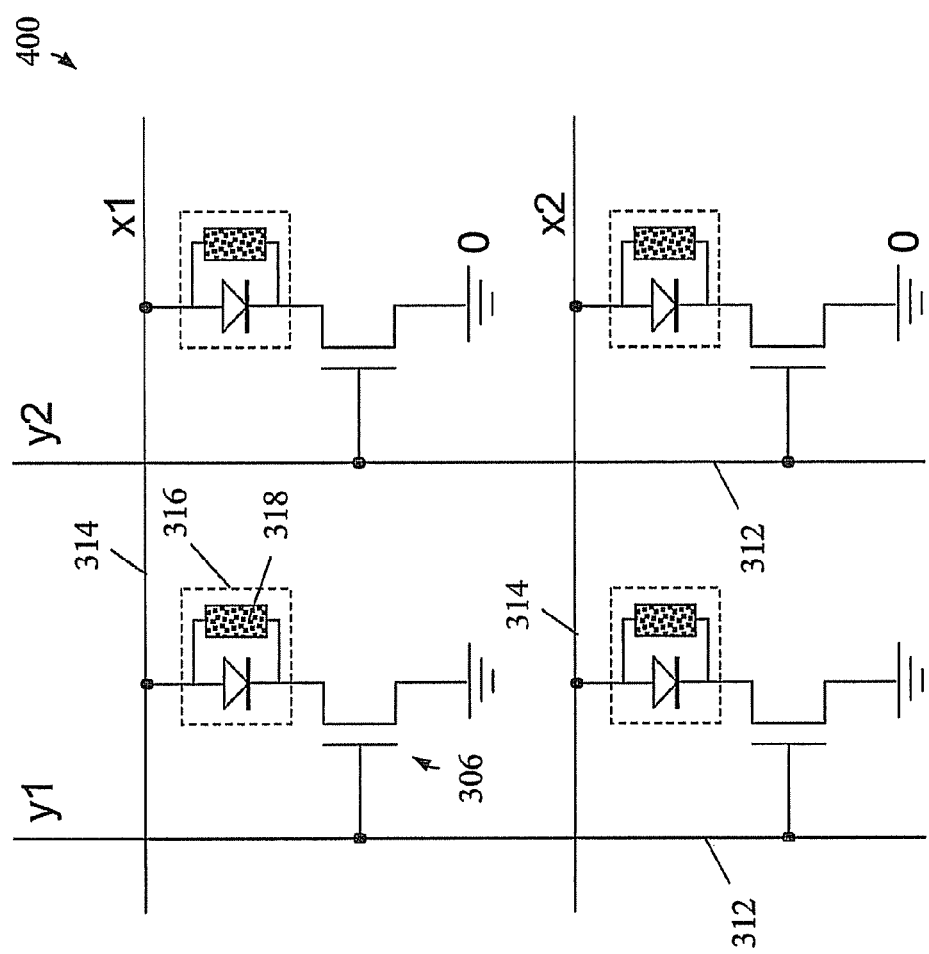
FIG. 5 is a schematic diagram illustrating the operation of a nanowire PCM memory array, in accordance with a further embodiment of the invention.
Figure 6A:
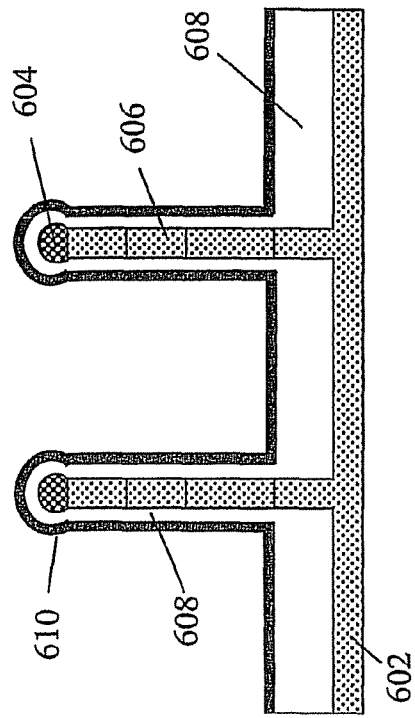
Figure 6B:
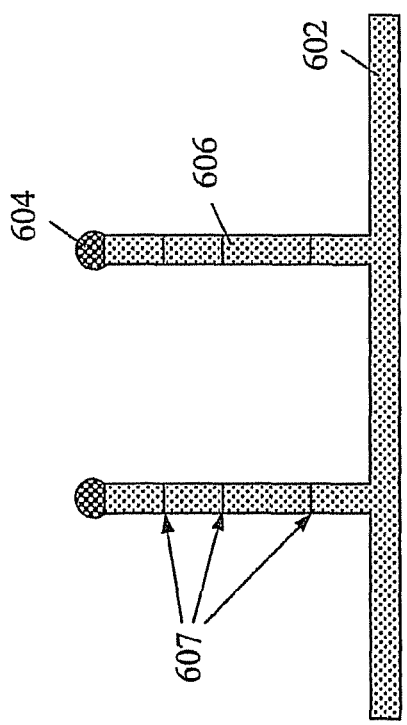
Figure 6C:
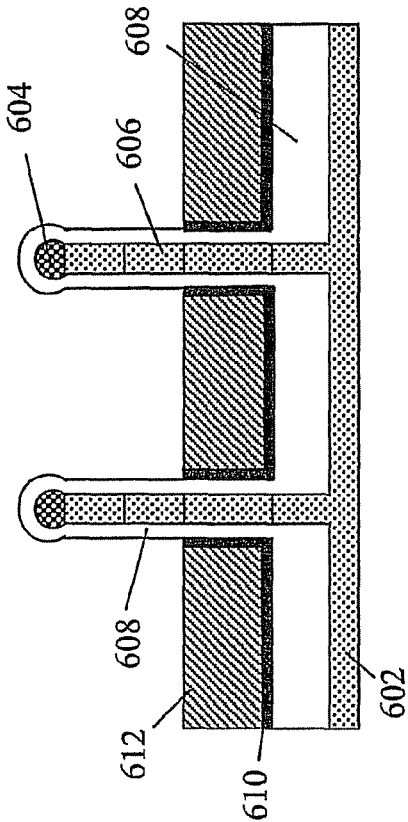
Figure 6D:
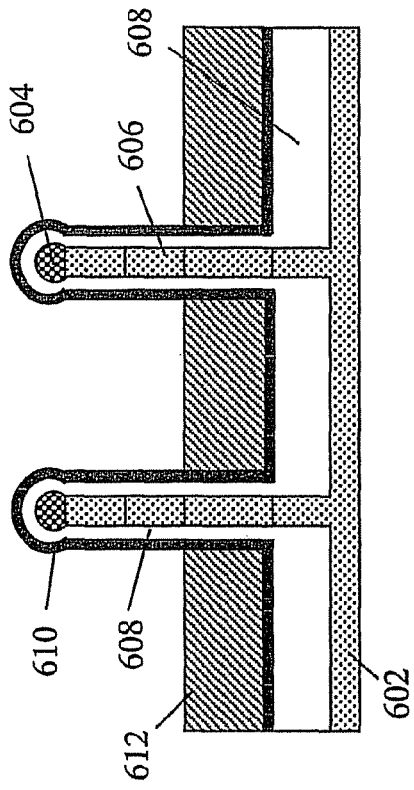
Figure 6E:
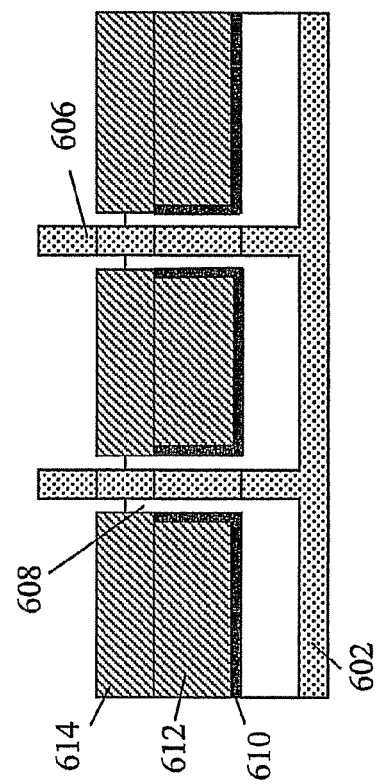
Figure 6F:
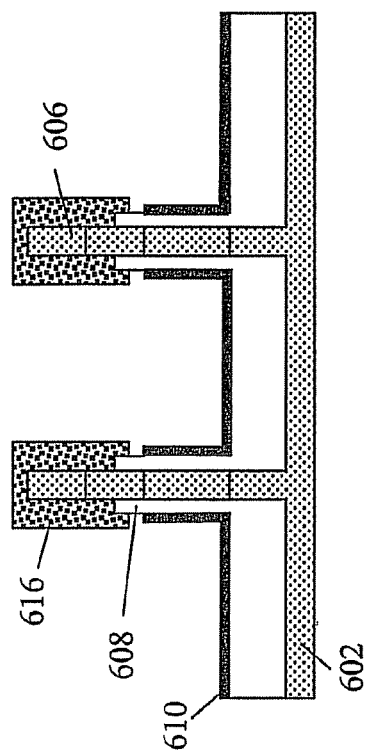
Figure 6G:
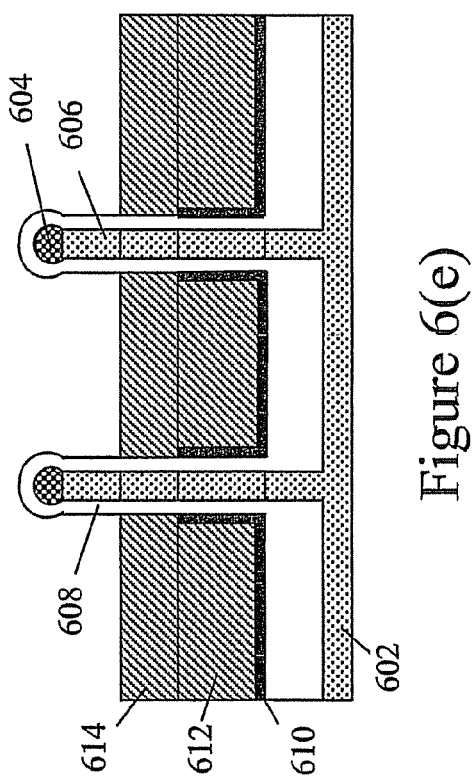
Figure 6H:
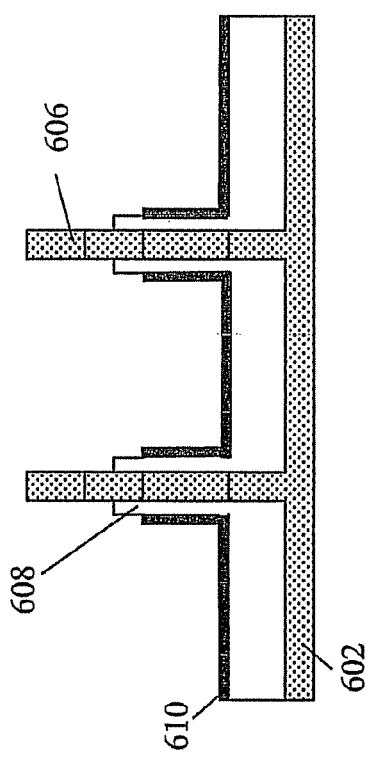

FIG. 5 is a schematic diagram illustrating the operation of the nanowire PCM memory array 400, in accordance with a further embodiment of the invention. The substrate (e.g., substrate 304, FIG. 3(*a*), from which the nanowires are grown) is assumed to be at zero or ground potential in the exemplary embodiment. With respect to a write operation, all cells enabled by a selected y-line (e.g., y1, y2, etc.) may be written simultaneously. All unselected y-lines are held at ground potential, while the selected y-line is set to some positive voltage in the neighborhood of about 0.5 V (depending on whether the write is a SET or RESET). Passive x-lines, whose bit value is to be unchanged in the column write operation, are kept at zero potential, thus preventing current through the associated cells, while active x-lines are set at approximately 1.2 V, in one non-limiting example. As a result, for the write-active cells, current flows through the forward biased p-n junction, in turn heating the PCM element to which it is thermally coupled (noting that there is also some small current through the PCM contributing to the heat budget for writing). Again, the applied heat pulse is a standard slow, low power annealing pulse to turn the PCM ON, and a fast, high current pulse to turn the PCM OFF.

With respect to a read operation for the memory array 400, all cells enabled by a selected y-line may be read simultaneously or sequentially. Here, unselected y-lines are at a negative voltage with respect to ground, in the neighborhood of about −0.5 V. The selected y-line is held at zero potential, while all selected x-lines are at −0.5 V. If the PCM element is in the ON state, then current flows around the reverse biased p-n junction into the x-line, where it is sensed. On the other hand, no current flows around the reversed biased p-n junction if the PCM element is in the OFF state.

It should be possible also to program intermediate levels of PCM resistance by varying the length of time and the current pulse during the write phase. Deep melting of the PCM can lead to a large volume of amorphous material after the quench, and therefore a large resistance, while shallow melting can lead to a low volume of the amorphous phase and a low resistance. The result of such variation is that there could be several (e.g., four) possible PCM memory states, allowing several (e.g., two) bits to be written per memory cell.

In the following estimates, an exemplary nanowire diameter of 15 nanometers (nm) is assumed, with a nanowire length on the order of about 0.5 microns ($\mu$m). An estimate of cell area is about 40×60 nm$^2$, thus allowing for a memory density of 10 GB/cm$^2$ with 2 bits per memory cell. The axial thermal conductivity of a silicon nanowire has been shown to be remarkably low, on the order of about 0.01 W/cm·K. Thus, for a nanowire of about 0.5 $\mu$m an in length, the axial heat flux when the PCM is heated to its melting point of approximately 600° C. is approximately 1 $\mu$W.

By way of further estimation, the PCM can be approximated as a sphere with a 30 nm radius with a heat sink at 60 nm radius, the space being filled with SiO$_2$ (whose thermal conductivity is 0.014 W/cm·K.) If all the PCM is at 600° C., then the approximate heat flux is 30 $\mu$W. However, it is assumed that in actual device operation with much of the outer part of the PCM still cool, when its lower thermal conductivity is about 0.006 W/cm·K, the PCM will act as a thermal blanket and reduce the heat flow. Moreover, a lower thermal conductivity material, such as SiCOH may replace the SiO$_2$. This, the actual heat flow, and heater power requirement, may be only 10 $\mu$W or less.

A 1024×1024 individual memory array matrix will be approximately 50 $\mu$m$^2$. For a wire length of 50 $\mu$m, a 20×20 nm metal wire will have a resistance on the order of about 1 K$\Omega$. If doped to a concentration of about 10$^{20}$ atoms/cm$^3$, a nanowire of 0.5 $\mu$m in length and 15 nm in diameter will have a resistance of about 12.5 K$\Omega$. The total metal and nanowire resistance in series is therefore about 13.5 K$\Omega$.

Typical PCM resistivities are shown in FIG. 1. At 0% doping, the ON resistance of a shell 50 nm in length and 10 nm in thickness around the nanowire is estimated to be on the order of about 50 K$\Omega$. This resistance can be sensed against the total wiring resistance on the order of about 13.5 K$\Omega$. The OFF resistance is three orders of magnitude higher and can easily be distinguished therefrom. Therefore, estimates show that the ON/OFF ratio may be easily distinguished with this array/memory cell design, while the power requirement for RESET is on the order of about 10 $\mu\Omega$.

Finally, FIGS. 6(*a*) through 6(*j*) are a series of cross-sectional views illustrating an exemplary process of forming a nanowire PCM memory element, in accordance with a further embodiment of the invention. As shown in FIG. 6(*a*), a substrate 602 (e.g., silicon) is patterned to accommodate an ordered array, such as a simple square lattice, of catalyst nanoparticles 604 (e.g., gold), which promotes the growth of silicon nanowires 606 or other types nanowires grown from an alternative semiconductor material, such as a group III-IV material for example. In an exemplary embodiment, the nanowires are formed by chemical vapor deposition (CVD) process in a temperature range of about 400° C. to about 800° C. The modulation doping of silicon or other type of nanowire to form a series of p-type and n-type doped regions along the longitudinal axis of the nanowire is accomplished by exposure to appropriate gaseous ambients during the growth process. In example depicted, the doping sequence n-p-n-p, beginning from the substrate 602, and moving upward is utilized to form an NFET device and series diode. However, as also indicated above, the opposite doping sequence p-n-p-n beginning from the substrate 602 moving upward would be utilized to form a PFET device and series diode. In either instance, the p-n junctions are depicted at 607 in FIG. 6(*a*).

After initial formation and doping of the nanowires 606, FIG. 6(*b*) illustrates the formation of a surround-gate dielectric layer 608, such as SiO$_2$, for example, over the substrate 602, nanowires 606 and catalyst tips 604. A suitable gate electrode layer 610 (e.g., aluminum) is then formed over the gate oxide layer. Then, as shown in FIG. 6(*c*), a gate patterning layer 612, such as a polyimide (PI) is formed over the resulting structure, deposited and etched to a height so as to protect portions of the gate electrode layer where the surround-gate electrode for the transistor portion of the nanowire 606 is to be defined. The removal of exposed portions of the gate electrode layer 610, such as by wet etching for example, is depicted in FIG. 6(*d*).

At this point, a more conventional "transistor only" nanowire process (where additional insulating material and top electrode would then be formed) is instead modified for the formation of the PCM portion of the memory cell. Proceeding to FIG. 6(*e*), another patterning layer 614 (e.g., a second PI layer) is deposited and etched down (e.g., by reactive ion etching (RIE)) to a higher level with respect to the top of the gate metal 610. This assures a separation between the gate metal 610 and the PCM, which is subsequently deposited. Then, as shown in FIG. 6(*f*), both the thin gate oxide layer 608 and the catalyst nanoparticle on the top portion of the nanowire 606 are removed. It will be noted that there is still a portion of the gate oxide layer 608 that extends upward beyond the top edge of the gate electrode layer 610.

Optionally, a very thin layer (e.g., about 1 nm) of Ti or TiN (not shown) may be sputtered on the exposed ends of the nanowires 606 to act as an adhesion layer for the subsequently formed PCM. In any case, the polyimide layers 612, 614 are then dissolved away, leaving the completed FET structure as depicted in FIG. 6(*g*). In FIG. 6(*h*), PCM 616 is sputter-deposited over the ends of the nanowires 606 using an oblique angle while rotating the sample. Because of the high vertical height to horizontal spacing aspect ratio of the wire (e.g., 20:1) the sputtered PCM 616 will form a cap on the nanowires 606, with very little penetration lower down the wire toward the FET structure, thereby surrounding the upper portion of the nanowire 606 as shown in FIG. 6(*h*).

Referring next to FIG. 6(*i*), additional insulating material 618 (e.g., $SiO_2$) is formed over the device. Finally, a chemical mechanical polishing (CMP) operation is then performed in order to planarize the top surface of the device and to expose the end of the nanowires 606 for contact to an electrode (x-line). As shown in FIG. 6(*j*), the top electrode 620 is formed, such as by using a mask involving purely repeated linear features (stripes). As is the case for the gate electrode metal, the x-line metal may be appropriately chosen (e.g., Al, W, etc.).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A memory cell device, comprising:
   a semiconductor nanowire extending, at a first end thereof, from a substrate;
   the nanowire having a doping profile so as to define a field effect transistor (FET) adjacent the first end, the FET further including a gate electrode at least partially surrounding the nanowire, the doping profile further defining a p-n junction in series with the FET, the p-n junction adjacent a second end of the nanowire; and
   a phase change material (PCM) at least partially surrounding the nanowire, at a location corresponding to the p-n junction.

2. The device of claim 1, further comprising:
   a data line connected to the second end of the nanowire; and
   a control line connected to the gate electrode of the FET.

3. The device of claim 2, wherein a state of the PCM is programmed by passing current through the p-n junction in a forward biased condition.

4. The device of claim 3, wherein a state of the PCM is read by applying a reverse bias voltage across the p-n junction.

5. The device of claim 4, wherein:
   the applied reverse bias voltage across the p-n junction results in substantially no current flowing into the data line when the PCM is programmed to a high resistance, amorphous state; and
   the applied reverse bias voltage across the p-n junction results in a detectable current, shunted around the p-n junction, through the PCM and flowing into the data line when the PCM is programmed to a low resistance, crystalline state.

6. The device of claim 1, wherein the doping profile comprises an n-p-n-p doping profile, beginning from the first end of the nanowire, such that the FET comprises an NFET.

7. The device of claim 1, wherein the doping profile comprises a p-n-p-n doping profile, beginning from the first end of the nanowire, such that the FET comprises a PFET.

8. A memory array, comprising:
   a plurality of semiconductor nanowires extending, at a first end thereof, from a substrate;
   each nanowire having a doping profile so as to define a field effect transistor (FET) adjacent the first end, each FET further including a gate electrode at least partially surrounding the nanowire, the doping profile further defining a p-n junction in series with the FET, the p-n junction adjacent a second end of the nanowire;
   a phase change material (PCM) at least partially surrounding the nanowire, at a location corresponding to the p-n junction;
   a plurality of data lines connected to the second end of the nanowires; and
   a plurality of control lines connected to the gate electrode of the FETs.

9. The memory array of claim 8, wherein a state of the PCM is programmed by passing current through the p-n junction in a forward biased condition.

10. The memory array of claim 9, wherein a state of the PCM is read by applying a reverse bias voltage across the p-n junction.

11. The memory array of claim 10, wherein:
    the applied reverse bias voltage across the p-n junction results in substantially no current flowing into the data line when the PCM is programmed to a high resistance, amorphous state; and
    the applied reverse bias voltage across the p-n junction results in a detectable current, shunted around the p-n junction, through the PCM and flowing into the data line when the PCM is programmed to a low resistance, crystalline state.

12. The memory array of claim 8, wherein the doping profile comprises an n-p-n-p doping profile, beginning from the first end of each nanowire, such that each FET comprises an NFET.

13. The memory array of claim 8, wherein the doping profile comprises a p-n-p-n doping profile, beginning from the first end of each nanowire, such that each FET comprises a PFET.

14. The memory array of claim 8, wherein the data lines and the control lines are arranged in a crossbar configuration with respect to the nanowires, the data lines disposed orthogonal with respect to the control lines.

15. A method of operating a memory array, the memory array comprising a plurality of semiconductor nanowires extending, at a first end thereof, from a substrate, with each nanowire having a doping profile so as to define a field effect transistor (FET) adjacent the first end, each FET further including a gate electrode at least partially surrounding the nanowire, the doping profile further defining a p-n junction in series with the FET, the p-n junction adjacent a second end of the nanowire, a phase change material (PCM) at least partially surrounding the nanowire, at a location corresponding to the p-n junction, a plurality of data lines connected to the second end of the nanowires, and a plurality of control lines connected to the gate electrode of the FETs, wherein the method comprises:

performing a write operation by coupling unselected control lines and the substrate to a ground voltage, while coupling a selected control line to a negative voltage; and coupling one or more selected data lines to a positive voltage so as cause a programming current to flow through each p-n junction corresponding to a selected control line and a selected data line, the programming current causing the PCM to assume one of a high resistance amorphous state and a low resistance crystalline state, depending on a duration and a magnitude of the programming current.

16. The method of claim 15, further comprising:

performing a read operation by coupling unselected control lines to a negative voltage, while coupling a selected control line and the substrate to a ground voltage; and coupling one or more selected data lines to a negative voltage so as cause a detectable read current to flow around each p-n junction and through the PCM corresponding to a selected control line and a selected data line, in the event the PCM is programmed to the low resistance crystalline state, wherein in the event the PCM is programmed to the high resistance amorphous state, current flow is substantially prevented by reverse bias of the p-n junction and the high resistance PCM.

17. The method of claim 16, wherein:

for the write operation, the programming current flows from the selected data line, through the nanowire comprising the series connected forward biased p-n junction and FET, to the substrate; and for the read operation, the detectable current flows from the substrate, through a portion of the nanowire comprising the FET, around the reverse biased p-n junction, through the PCM when programmed to the low resistance crystalline state, to the selected data line.

18. The method of claim 17, further comprising forming one or more data lines connecting the second ends of the nanowires.

19. The method of claim 18, further comprising forming one or more control lines connecting the gate electrodes of the FETs.

20. The method of claim 19, wherein the data lines and the control lines are arranged in a crossbar configuration with respect to the nanowires, the data lines disposed orthogonal with respect to the control lines.

* * * * *